US012696427B2

(12) United States Patent
Ji et al.

(10) Patent No.: US 12,696,427 B2
(45) Date of Patent: Jul. 28, 2026

(54) LIQUID COOLING DEVICE AND SERVER

(71) Applicants: Inventec (Pudong) Technology Corporation, Shanghai (CN); INVENTEC CORPORATION, Taipei (TW)

(72) Inventors: Jiaqing Ji, Shanghai (CN); Jingnan Zhao, Shanghai (CN); Boheng Zeng, Shanghai (CN)

(73) Assignees: Inventec (Pudong) Technology Corporation, Shanghai (CN); INVENTEC CORPORATION, Taipei (TW)

( * ) Notice: Subject to any disclaimer, the term of this patent is extended or adjusted under 35 U.S.C. 154(b) by 258 days.

(21) Appl. No.: 18/748,119

(22) Filed: Jun. 20, 2024

(65) Prior Publication Data

US 2025/0358957 A1 Nov. 20, 2025

(30) Foreign Application Priority Data

May 14, 2024 (CN) .......................... 202410598544.6

(51) Int. Cl.
H05K 7/20 (2006.01)
H05K 1/02 (2006.01)
H05K 1/14 (2006.01)

(52) U.S. Cl.
CPC ....... H05K 7/20772 (2013.01); H05K 1/0203 (2013.01); H05K 1/144 (2013.01); H05K 7/20254 (2013.01); H05K 7/20272 (2013.01); *H05K 2201/042* (2013.01)

(58) Field of Classification Search
CPC ........... H05K 7/20254; H05K 7/20636; H05K 7/20645; H05K 7/20772; H05K 7/20781; H05K 1/144
See application file for complete search history.

(56) References Cited

U.S. PATENT DOCUMENTS

| | | | | |
|---|---|---|---|---|
| 8,363,412 B2 * | 1/2013 | Budai | ..................... | G06F 1/185 |
| | | | | 361/679.48 |
| 8,385,068 B2 * | 2/2013 | Jacobson | .............. | H02M 7/003 |
| | | | | 361/689 |
| 12,089,367 B2 * | 9/2024 | Wu | ..................... | H05K 7/20772 |
| 2025/0048590 A1 * | 2/2025 | Li | ........................... | G06F 1/206 |
| 2025/0358975 A1 * | 11/2025 | Ji | ....................... | H05K 7/20772 |

* cited by examiner

*Primary Examiner* — Robert J Hoffberg

(57) ABSTRACT

A liquid cooling device and a server are provided. The liquid cooling device includes at least two motherboards that are stacked, and each motherboard being provided with at least two heat generating elements; and a plurality of liquid cooling plates attached to the plurality of heat generating elements in a one-to-one correspondence. One liquid cooling plate corresponding to one motherboard is connected to another liquid cooling plate corresponding to another motherboard in series to form a liquid cooling loop, and a plurality of liquid cooling loops are connected in parallel.

12 Claims, 3 Drawing Sheets

LIQUID COOLING DEVICE AND SERVER

CROSS-REFERENCE TO RELATED APPLICATIONS

This application claims priority of Chinese Patent Application No. 202410598544.6, filed on May 14, 2024, entitled "LIQUID COOLING DEVICE AND SERVER", the entire content of which is incorporated herein in its entirety.

TECHNICAL FIELD

The present disclosure relates to servers, and in particular to a liquid cooling device and a server.

BACKGROUND

With the rapid development of cloud computing, big data and artificial intelligence and the rise of cloud computing, the demand for computing power in data processing centers is growing rapidly. Since a single processor is difficult to meet the rapidly rising demand for computing power, the use of multiple processors in series and parallel has become one of the common ways to improve the overall computing performance, such parallel processing manner can make full use of the computing power of multiple processors to achieve more efficient data processing.

However, as one of main heat generating elements of the server, the processor generates a lot of heat during operation, and the continuous high temperature will affect the performance of the processor, and even cause damage to the processor. Therefore, how to effectively dissipate heat from a plurality of heat generating elements at the same time becomes a problem that needs to be solved urgently.

SUMMARY

Accordingly, a liquid cooling device and a server are provided.

According to a first aspect, a liquid cooling device is provided, including at least two motherboards that are stacked, and each motherboard being provided with at least two heat generating elements; and a plurality of liquid cooling plates attached to the plurality of heat generating elements in a one-to-one correspondence. One liquid cooling plate corresponding to one motherboard is connected to another liquid cooling plate corresponding to another motherboard in series to form a liquid cooling loop, and a plurality of liquid cooling loops are connected in parallel.

According to the aforementioned liquid cooling device, at least two motherboards are stacked, at least two heat generating elements are provided on each motherboard, the plurality of liquid cooling plates are attached to the plurality of heat generating elements in a one-to-one correspondence, and one liquid cooling plate corresponding to one motherboard 200 is connected to another liquid cooling plate corresponding to another motherboard in series to form the liquid cooling loop. Therefore, when the coolant is supplied into the liquid cooling loop, the coolant can simultaneously cool the two heat generating elements corresponding to the two liquid cooling plates in the liquid cooling loop, so as to dissipate heat from the two heat generating elements provided on each motherboard to reduce a temperature of each heat generating element. Therefore, when the coolant flows into the plurality of cross-layer liquid cooling loops at the same time, the liquid cooling device can effectively dissipate heat from the plurality of heat generating elements at the same time, so as to prevent the motherboard from being damaged by high temperature. Since one liquid cooling plate corresponding to one motherboard is connected to another liquid cooling plate corresponding to another motherboard in series to form the liquid cooling loop, compared with the related art that a single liquid cooling plate forms a liquid cooling loop, there is no need to provide a separated communication loop for each liquid cooling plate in the liquid cooling device, which not only can effectively reduce a space occupied by pipes of the liquid cooling device, but also can fully utilize cooling capacity of the coolant, so as to avoid resource waste while ensuring a heat dissipation effect. In addition, since each liquid cooling plate is attached to a surface of the corresponding heat generating element, when a space corresponding to the motherboard is relatively narrow due to the stacked arrangement of the plurality of motherboards, the plurality of liquid cooling plates in the liquid cooling device can still effectively dissipate heat from the plurality of heat generating elements forming an upper-lower layer structure by using the coolant flowing in the liquid cooling plates. Therefore, compared with the conventional air cooling device, the liquid cooling device can effectively dissipate heat from the plurality of heat generating elements at the same time under a condition of limited space, thereby avoiding the influence of continuous high temperature from affecting the stability and reliability of the motherboard during operation.

In one of the embodiments, the plurality of liquid cooling plates comprises a first liquid cooling plate, a second liquid cooling plate, a third liquid cooling plate, and a fourth liquid cooling plate, the first liquid cooling plate and the second liquid cooling plate are respectively attached to two corresponding heat generating elements located on one motherboard, the third liquid cooling plate and the fourth liquid cooling plate are respectively attached to two corresponding heat generating elements located on another motherboard, the first liquid cooling plate and the third liquid cooling plate are connected in series to form a first liquid cooling loop, the second liquid cooling plate and the fourth liquid cooling plate are connected in series to form a second liquid cooling loop, and the first liquid cooling loop and the second liquid cooling loop are connected in parallel.

In one of the embodiments, the liquid cooling device further includes a plurality of series pipes and a plurality of branch pipe, each liquid cooling plate is provided with a water inlet and a water outlet, in the two liquid cooling plates forming the liquid cooling loop, the water inlet of one liquid cooling plate is in communication with the water outlet of another liquid cooling plate through one series pipe, and the water inlet of the one liquid cooling plate and the water outlet of the another liquid cooling plate are in communication with two branch pipes, respectively.

In one of the embodiments, the liquid cooling device further includes a plurality of first connecting joints in communication with the water outlets, the water inlets, the series pipes, and the branch pipes.

In one of the embodiments, each first connecting joint comprises a first connecting portion, a first fixing portion, and a first pagoda portion that are sequentially connected, the first connecting portion is in communication with the corresponding water outlet or water inlet, an outer periphery of the first pagoda portion is provided with at least two conical protrusion structures, the first pagoda portion is in communication with the corresponding series pipe or branch pipe, and the first fixing portion is threadedly connected to a nut, so as to fix the first pagoda portion to the corresponding series pipe or branch pipe.

In one of the embodiments, each motherboard has a first side and a second side, the two liquid cooling plates in one liquid cooling loop comprises a first liquid cooling plate and a third liquid cooling plate, the at least two motherboards comprises a first motherboard corresponding to the first liquid cooling plate and a second motherboard corresponding to the third liquid cooling plate, a gap is formed between the first motherboard and the second motherboard, the third liquid cooling plate is provided in the gap, one end of the series pipe is connected the third liquid cooling plate, another end of the series pipe bypasses the first motherboard from the first side and is connected to the third liquid cooling plate, an end of the branch pipe connected to the first liquid cooling plate, which is away from the first liquid cooling plate, bypasses the first motherboard from the first side and extends through the gap to the second side, and an end of the branch pipe connected to the third liquid cooling plate, which is away from the third liquid cooling plate, extends through the gap to the second side.

In one of the embodiments, the liquid cooling device further includes a liquid distributor, a liquid supply pipe, and a liquid return pipe, the two branch pipes of each liquid cooling loop are in communication with the liquid distributor, and the liquid distributor is provided with a liquid entering port in communication with the liquid supply pipe and a liquid return port in communication with the liquid return pipe.

In one of the embodiments, the liquid distributor is provided with a plurality of liquid outlets and a plurality of liquid inlets, the plurality of liquid outlets are in communication with the branch pipes in communication with the water inlet in the plurality of liquid cooling loops in a one-to-one correspondence, and the plurality of liquid inlets are in communication with the branch pipes in communication with the water outlets in the plurality of liquid cooling loops in a one-to-one correspondence.

In one of the embodiments, the liquid cooling device further includes a plurality of second connecting joints located at the plurality of liquid outlets and the plurality of liquid inlets, respectively, each second connecting joint comprises a second connecting portion, a second fixing portion, and a second pagoda portion that are sequentially connected, the liquid outlets and the liquid inlets are each in communication with the corresponding second connecting portion, an outer periphery of the second pagoda portion is provided with at least two conical protrusion structures, the second pagoda portion is in communication with the corresponding branch pipe, and the second fixing portion is configured to be threadedly connected to a nut, so as to fix the second pagoda portion to the corresponding branch pipe.

In one of the embodiments, an end of the liquid supply pipe away from the liquid distributor is provided with a first quick-connecting male joint configured to be in communication with a first quick-connecting female joint of a liquid cooling distribution assembly, an end of the liquid return pipe away from the liquid distributor is provided with a second quick-connecting male joint configured to be in communication with a second quick-connecting female joint of the liquid cooling distribution assembly.

In one of the embodiments, the liquid cooling device further includes a plurality of fixing members configured to fix the liquid cooling plates to the corresponding motherboards.

According to a second aspect, a server is further provided, including the aforementioned liquid cooling device.

According to the server, since the at least two motherboards are stacked, and each motherboard is provided with at least two heat generating elements, the heat generating elements provided on different motherboards can form an upper-lower layer structure, so that the space occupied by the plurality of motherboards can be reduced, thereby facilitating the miniaturization of the server. Since the plurality of liquid cooling plates are attached to the plurality of heat generating elements in a one-to-one correspondence, and one liquid cooling plate corresponding to one motherboard is connected to another liquid cooling plate 1 corresponding to another motherboard in series to form the liquid cooling loop. When the coolant is supplied into each liquid cooling loop, the plurality of liquid cooling plates in the liquid cooling device can utilize the coolant to effectively dissipate heat from the plurality of heat generating elements forming the upper-lower structure, and the problem of poor heat dissipation due to the narrow space corresponding to the motherboard is avoided, thereby ensuring the stable and reliable operation of the motherboard. Since the two liquid cooling plates corresponding to different motherboards are connected in series to form the liquid cooling loop, compared with the related art that a single liquid cooling plate forms a liquid cooling loop, there is no need to provide a separated communication loop for each liquid cooling plate in the liquid cooling device, which is not only conducive to the miniaturization of the server, but also can fully utilize cooling capacity of the coolant, so as to avoid resource waste while ensuring a heat dissipation effect.

The details of one or more embodiments of the present disclosure are set forth in the accompanying drawings and the description below. Other features, objects and advantages of the present disclosure will become apparent from the description, the accompanying drawings, and the claims.

BRIEF DESCRIPTION OF THE DRAWINGS

The drawings constitute a part of the present disclosure and are used to provide a further understanding of the present disclosure. The exemplary embodiments of the present disclosure and their descriptions are used to explain the present disclosure and do not constitute an improper limitation of the present disclosure.

To illustrate the technical solutions according to the embodiments of the present invention or in the prior art more clearly, the accompanying drawings for describing the embodiments or the prior art are introduced briefly in the following. Apparently, the accompanying drawings in the following description are only some embodiments of the present invention, and persons of ordinary skill in the art can derive other drawings from the accompanying drawings without creative efforts.

Additionally, the figures are not shown in a scale of 1:1, and the relative dimensions of the various elements are illustrated in the figures by way of example, and not necessarily to a true scale.

Figures 1, 2:
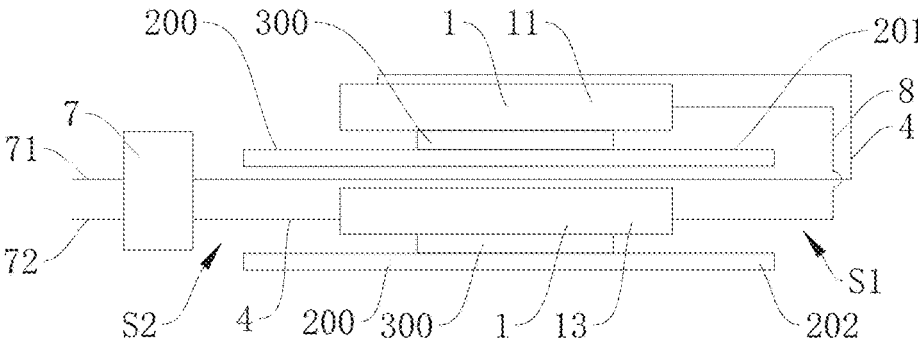

FIG. 1 is a perspective view of a liquid cooling device according to an embodiment of the present disclosure.

FIG. 2 is a block diagram of a liquid cooling device according to an embodiment of the present disclosure.

Figure 3:
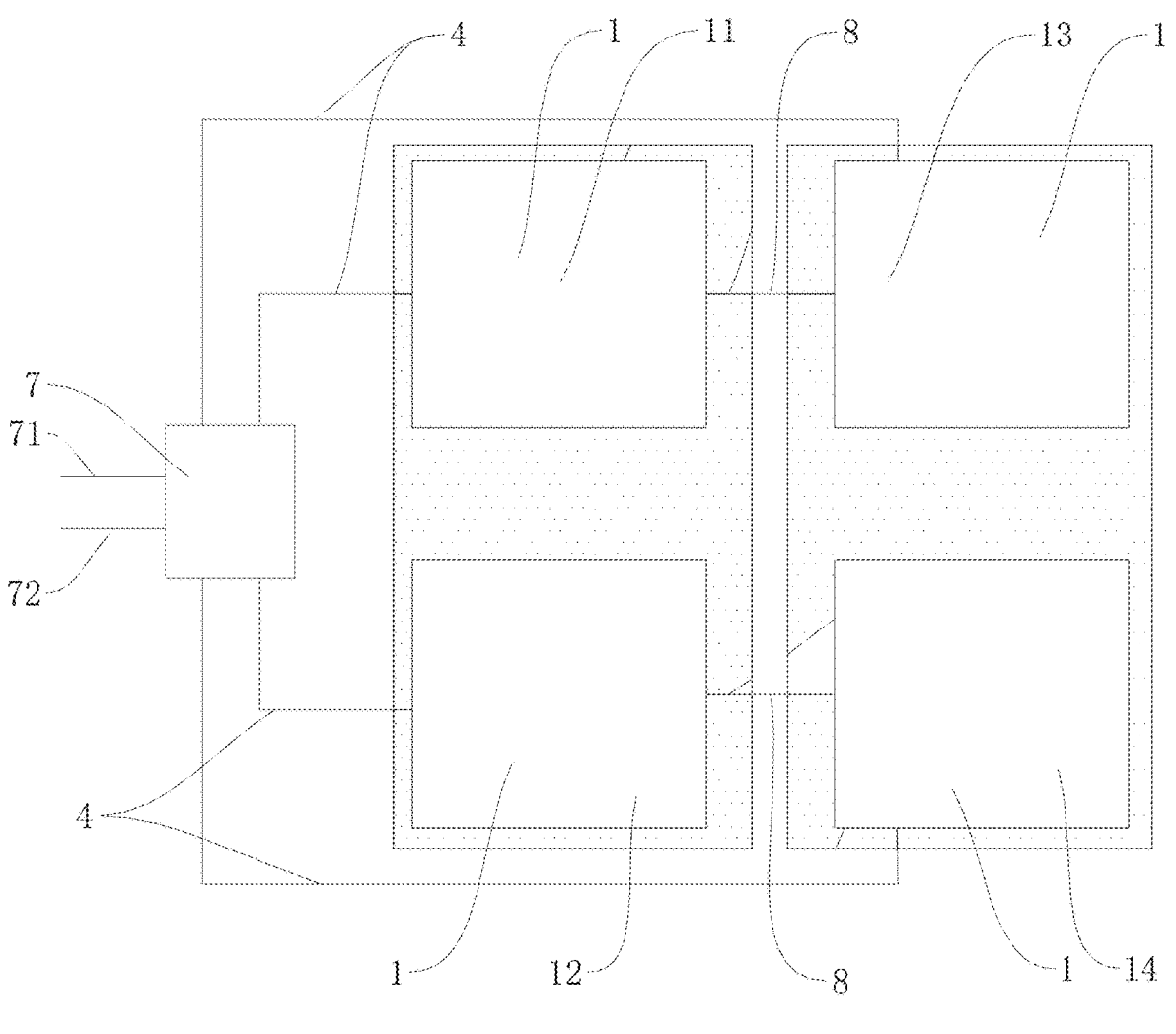

FIG. 3 is a block diagram of a liquid cooling loop according to an embodiment of the present disclosure.

Figure 4:
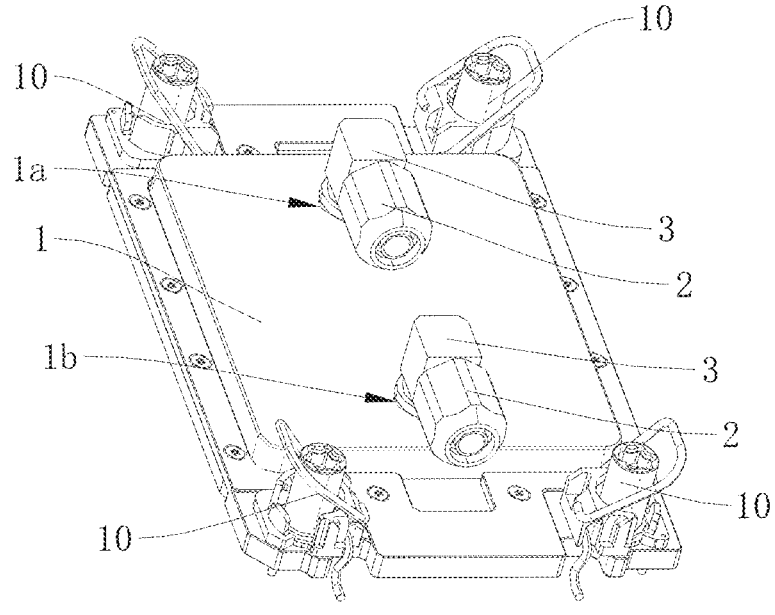

FIG. 4 is a perspective view of a liquid cooling plate according to an embodiment of the present disclosure.

Figure 5:
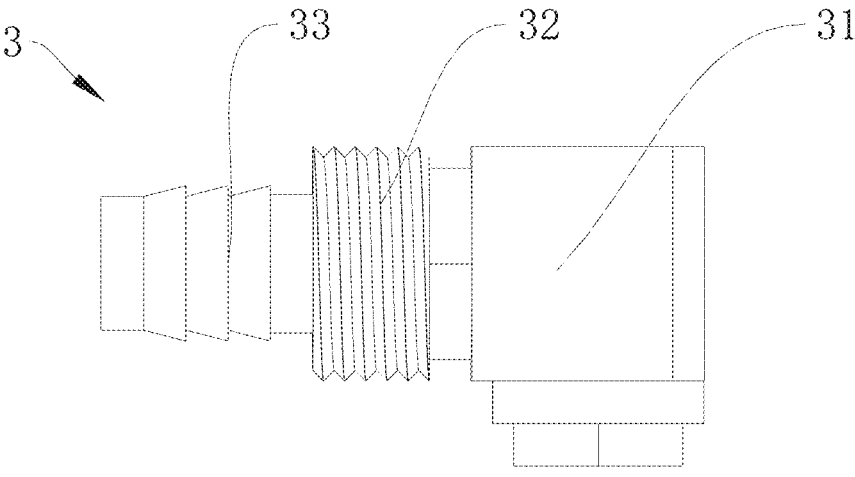

FIG. 5 is a side view of a first connecting joint of FIG. 4.

DESCRIPTION OF REFERENCE SIGNS

100. Liquid cooling device; 200. Motherboard; 201. First motherboard; 202. Second motherboard; S1. First side;

S2. Second side; 300. Heat generating element; 10. Fixing member; 1. Liquid cooling plate; 1*a*. Water inlet; 1*b*. Water outlet; 11. First liquid cooling plate; 12. Second liquid cooling plate; 13. Third liquid cooling plate; 14. Fourth liquid cooling plate; 101. First liquid cooling plate; 102. Second liquid cooling plate; 2. Nut; 30. Second connecting joint; 3. First connecting joint; 31. First connecting portion; 32. First fixing portion; 33. First pagoda portion; 4. Branch pipe; 5. First quick-connecting male joint; 6. Second quick-connecting male joint; 7. Liquid distributor; 71. Liquid supply pipe; 72. Liquid return pipe; 8. Series pipe.

DETAILED DESCRIPTION OF THE EMBODIMENTS

In order to make the above objects, features and advantages of the present disclosure clear and easier to understand, the specific embodiments of the present disclosure are described in detail below in combination with the accompanying drawings. Many specific details are set forth in the following description to facilitate a full understanding of the present disclosure. However, the present disclosure can be implemented in many ways different from those described herein, and those skilled in the art can make similar improvements without departing from the connotation of the present disclosure. Therefore, the present disclosure is not limited by the specific embodiments disclosed below.

In the description of the present disclosure, it should be understood that the terms "center", "longitudinal", "transverse", "length", "width", "thickness", "upper", "lower", "front", "rear", "left", "right", "vertical", "horizontal", "top", "bottom", "inner", "outer", "clockwise", "counterclockwise", "axial", "radial", "circumferential direction" are based on the azimuth or position relationship shown in the attached drawings, which are only for the convenience of describing the present disclosure and simplifying the description, rather than indicating or implying that the device or element must have a specific azimuth, be constructed and operated in a specific azimuth, so such terms cannot be understood as a limitation of the present disclosure.

In addition, the terms "first" and "second" are only used for descriptive purposes and cannot be understood as indicating or implying relative importance or implicitly indicating the number of indicated technical features. Thus, the features defined with "first" and "second" may explicitly or implicitly include at least one of the features. In the description of the present disclosure, "a plurality of" means at least two, such as two, three, etc., unless otherwise expressly and specifically defined.

In the present disclosure, unless otherwise expressly specified and limited, the terms "mount", "connect", "contact", "fix" and other terms should be understood in a broad sense, for example, they can be fixed connections, detachable connections, or integrated. They can be mechanical connection or electrical connection. They can be directly connected or indirectly connected through an intermediate medium. They can be the connection within two elements or the interaction relationship between two elements, unless otherwise expressly limited. For those skilled in the art, the specific meaning of the above terms in the present disclosure can be understood according to the specific situation.

In the present disclosure, unless otherwise expressly specified and limited, the first feature "above" or "below" the second feature may be in direct contact with the first and second features, or the first and second features may be in indirect contact through an intermediate medium. Moreover, the first feature is "above" the second feature, but the first feature is directly above or diagonally above the second feature, or it only means that the horizontal height of the first feature is higher than the second feature. The first feature is "below" of the second feature, which can mean that the first feature is directly below or obliquely below the second feature, or simply that the horizontal height of the first feature is less than that of the second feature.

It should be noted that when an element is called "fixed to" or "provided on" another element, it can be directly on another element or there can be a centered element. When an element is considered to be "connected" to another element, it can be directly connected to another element or there may be intermediate elements at the same time. The terms "vertical", "horizontal", "up", "down", "left", "right" and similar expressions used herein are for the purpose of illustration only and do not represent the only embodiment.

Referring to FIGS. 1 to 3, a liquid cooling device 100 is provided according to an embodiment of the present disclosure. The liquid cooling device 100 includes at least two motherboards 200 and a plurality of liquid cooling plates 1. The at least two motherboards 200 are stacked, and each motherboard 200 is provided with at least two heat generating elements 300. The plurality of liquid cooling plates 1 are attached to the plurality of heat generating elements 300 in a one-to-one correspondence. One liquid cooling plate 1 corresponding to one motherboard 200 is connected to another liquid cooling plate 1 corresponding to another motherboard 200 in series to form a liquid cooling loop that spans the two motherboards 200, and a plurality of liquid cooling loops are connected in parallel.

According to the aforementioned liquid cooling device 100, at least two motherboards 200 are stacked, at least two heat generating elements 300 are provided on each motherboard 200, the plurality of liquid cooling plates 1 are attached to the plurality of heat generating elements 300 in a one-to-one correspondence, and one liquid cooling plate 1 corresponding to one motherboard 200 is connected to another liquid cooling plate 1 corresponding to another motherboard 200 in series to form the liquid cooling loop that spans the two motherboards 200. Therefore, when the coolant is supplied into the liquid cooling loop, the coolant can simultaneously cool the two heat generating elements 300 corresponding to the two liquid cooling plates 1 in the liquid cooling loop, so as to dissipate heat from the two heat generating elements 300 provided on each motherboard 200 to reduce a temperature of each heat generating element 200. Therefore, when the coolant flows into the plurality of cross-layer liquid cooling loops at the same time, the liquid cooling device 100 can effectively dissipate heat from the plurality of heat generating elements 300 at the same time, so as to prevent the motherboard 200 from being damaged by high temperature. Since one liquid cooling plate 1 corresponding to one motherboard 200 is connected to another liquid cooling plate 1 corresponding to another motherboard 200 in series to form the liquid cooling loop, compared with the related art that a single liquid cooling plate forms a liquid cooling loop, there is no need to provide a separated communication loop for each liquid cooling plate 1 in the liquid cooling device 100, which not only can effectively reduce a space occupied by pipes of the liquid cooling device 100, but also can fully utilize cooling capacity of the coolant, so as to avoid resource waste while ensuring a heat dissipation effect. In addition, since each liquid cooling plate 1 is attached to a surface of the corresponding heat generating element 300, when a space corresponding to the motherboard 200 is relatively narrow due to the stacked arrangement of the plurality of motherboards 200, the plurality of liquid cooling plates 1 in the liquid cooling device 100 can still effectively dissipate heat from the plurality of heat generating elements 300 forming an upper-lower layer structure by using the coolant flowing in the liquid cooling plates 1. Therefore, compared with the conventional air cooling device, the liquid cooling device 100 can effectively dissipate heat from the plurality of heat generating elements 300 at the same time under a condition of limited space, thereby avoiding the influence of continuous high temperature from affecting the stability and reliability of the motherboard 200 during operation.

The number of the motherboards 200 may be configured as required, for example, two, three, four, or more. The number of the heat generating elements 300 provided on each motherboard 200 may be the same or different, as long as one liquid cooling plate 1 corresponding to one motherboard 200 can be connected in series to another liquid cooling plate 1 corresponding to another motherboard 200 to form the liquid cooling loop. For example, two heat generating elements 300 are provided on each motherboard 200, so that two liquid cooling plates 1 corresponding to one motherboard 200 can be connected to another two liquid cooling plates 1 corresponding to another motherboard 200 in a one-to-one correspondence.

The heat generating element 300 includes, but is not limited to, a central processing unit (CPU), a graphics processing unit (GPU), etc.

In an embodiment, referring to FIGS. 1 to 3, the plurality of liquid cooling plates 1 include a first liquid cooling plate 11, a second liquid cooling plate 12, a third liquid cooling plate 13, and a fourth liquid cooling plate 14. The first liquid cooling plate 11 and the second liquid cooling plate 12 are respectively attached to two heat generating elements 300 located on one motherboard 200. The third liquid cooling plate 13 and the fourth liquid cooling plate 14 are respectively attached to two heat generating elements 300 located only can effectively reduce the space occupied by the pipes in the liquid cooling device 100, but also can fully utilize the cooling capacity of the coolant, so as to avoid resource waste while ensuring the heat dissipation effect.

Referring to FIG. 2, the motherboards 200 includes a first motherboard 201 corresponding to the first liquid cooling plate 11 and a second motherboard 202 corresponding to the third liquid cooling plate 13, and the relative position relationship between the first motherboard 201 and the second motherboard 202 can be configured as required. For example, the second motherboard is located above the first motherboard. Alternatively, the second motherboard 202 is located below the first motherboard 201.

In order to better explain that when the coolant flows into the two liquid cooling plates 1 connected in series, not only the cooling capacity of the coolant can be fully utilized, but also the heat dissipation effect on each heat generating element 300 can be ensured, taking the heat generating element 300 as a CPU as an example in the following. Heat dissipation model simulation data are compared between the liquid cooling loop formed by a single liquid cooling plate 1 and the liquid cooling loop formed by two liquid cooling plates 1 connected in series.

Basic data for performing the model simulation includes: a total CPU power consumption of 350 W, a maximum CPU surface temperature (Tcase max) of 55° C., a CPU core (CPU die) power of 350 W, a CPU core (Core die) size of 23.26×20.58, a CPU core (Core die) heat flux density of 18.27 W/cm$^2$, a CPU surface temperature (CPU Tcase) of 49.2° C., and a fluid temperature rise of 1 LPM@40° C. of 4.97° C.

According to the above basic data, the liquid cooling loop composed of a single liquid cooling plate 1 is used to simulate the heat dissipation on a single CPU, and the change of CPU temperature with coolant flow rate is shown in the following table:

| Coolant flow rate (LPM) | 0.5 | 0.8 | 1.0 | 1.2 | 1.4 | 1.6 | 1.8 | 2.0 | 3.0 | 4.0 |
|---|---|---|---|---|---|---|---|---|---|---|
| Tcase (° C.) | 54.0 | 50.4 | 49.2 | 48.4 | 47.8 | 47.4 | 47.1 | 46.8 | 46.1 | 45.7 | on another motherboard 200. The first liquid cooling plate 11 and the third liquid cooling plate 13 are connected in series to form a first liquid cooling loop, the second liquid cooling plate 12 and the fourth liquid cooling plate 14 are connected in series to form a second liquid cooling loop, and the first liquid cooling loop and the second liquid cooling loop are connected in parallel. In this way, when the coolant flows into the first liquid cooling loop and the second liquid cooling loop, the first liquid cooling plate 11, the second liquid cooling plate 12, the third liquid cooling plate 13, and the fourth liquid cooling plate 14 can dissipate the heat from the corresponding heat generating elements 300 in time, so as to cool the four heat generating elements 300 at the same time, thereby avoiding the motherboard 200 from being damaged by high temperature. Since the four liquid cooling plates are connected in series in pairs to form the liquid cooling loop, compared with the solution that a single liquid cooling plate 1 forms a liquid cooling loop, there is no need to provide a separated communication loop for each liquid cooling plate 1 in the liquid cooling device 100, which not It can be seen from the above table that the temperature of the CPU decreases as the coolant flow rate increases, and it can be seen from a specification that a temperature specification (Tcase spec) of the surface of the CPU under this working condition is 65° C. It can be seen from the above data that the temperature (Tcase) of the surface of the CPU is less than the temperature specification (Tcase spec) of the surface of the CPU, so that the temperature margin of the coolant is sufficient when the coolant flows into the liquid cooling loop to cool the CPU. Based on this, when the liquid cooling loop composed of a single liquid cooling plate 1 is used to dissipate heat from single CPU, it has a good heat dissipation effect.

According to the above basic data and temperature theoretical calculation, the liquid cooling loop formed by two liquid cooling plates 1 connected in series is used to simulate the synchronous heat dissipation on two CPUs, and a temperature of an upstream liquid cooling plate 1 and a temperature of a downstream liquid cooling plate 1 in the liquid cooling loop are shown in the following table:

| Coolant flow rate | Temperature (Tcase) of the surface of the upstream liquid cooling plate | Temperature difference ΔT of the liquid cooling plate | Temperature (Tcase) of the surface of the downstream liquid cooling plate |
|---|---|---|---|
| 0.8 LPM | 50.4° C. | 6.3° C. | 56.7° C. |
| 1.0 LPM | 49.2° C. | 5.0° C. | 54.2° C. |
| 1.2 LPM | 48.4° C. | 4.2° C. | 52.6° C. |
| 1.4 LPM | 47.8° C. | 3.6° C. | 51.4° C. |
| 1.6 LPM | 47.4° C. | 3.1° C. | 50.5° C. |
| 1.8 LPM | 47.1° C. | 2.8° C. | 49.9° C. |
| 2.0 LPM | 46.8° C. | 2.5° C. | 49.3° C. |

It can be seen from the above table that, compared with the design solution in which a single liquid cooling loop formed by a single liquid cooling plate 1 cools a single CPU, the design solution in which two liquid cooling plates 1 are connected in series to form the liquid cooling loop for synchronous heat dissipation on two CPUs, the temperatures of the two liquid cooling plates 1 in the series loop will also gradually decrease as the coolant flow rate increases, and the temperature difference between the upstream liquid cooling plate 1 and the downstream liquid cooling plate 1 is gradually decrease as the coolant flow rate increases. In addition, when the temperature specification (Tcase spec) of the surface of the CPU is 65° C., it can be seen from the above data that the temperature (Tcase) of the surface of the upstream cooling plate and the temperature (Tcase) of the surface of the downstream liquid cooling plate are both less than the temperature specification (Tcase spec) of the surface of the CPU. The temperature of the surface of the liquid cooling plate is the same as the temperature of the surface of the CPU. Therefore, when the two liquid cooling plates 1 are connected in series to form the liquid cooling loop for simultaneously dissipating heat from the two heat generating elements 300, the liquid cooling loop can not only ensure a better heat dissipation effect, but also ensure more uniform heat dissipation between the liquid cooling plates 1. Based on this, it can be seen that the design in which the two liquid cooling plates 1 are connected in series to simultaneously cool the two heat generating elements 300 can more fully utilize the cooling capacity of the coolant, which is beneficial to avoiding the waste of resources.

A theoretical calculation formula of temperature includes an energy formula Q=cmΔT, a volume flow formula qv=V/t=m/ρt, and a liquid cooling plate temperature difference formula ΔT=P/ρqvc=0.0143 P/qv. In the energy formula, Q is heat and its unit is J, C is specific heat capacity and its unit is J/kg·° C., m is a mass and its unit is kg, ΔT is a temperature difference and its unit is ° C. In the volume flow formula, qv is a coolant volume flow rate and its unit is m³/s, m is a mass and its unit is kg, ρ is a coolant density and its unit is kg/m³, t is a time and its unit is s. In the liquid cooling plate temperature difference formula, P is a CPU power consumption and its unit is W.

In an embodiment, referring to FIGS. 1 to 4, the liquid cooling device 100 further includes a plurality of series pipes 8 and a plurality of branch pipes 4. Each liquid cooling plate 1 is provided with a water inlet 1a and a water outlet 1b. In the two liquid cooling plates 1 forming one liquid cooling loop, the water inlet 1a of one first liquid cooling plate 1 is in communication with the water outlet 1b of the other liquid cooling plate 1 through one series pipe 8, and the water inlet 1a of the one liquid cooling plate 1 and the water outlet 1b of the other liquid cooling plate 1 are in communication with two branch pipes 4, respectively. In this way, when the coolant flows into the liquid cooling loop, the coolant can flow into the one liquid cooling plate 1 from the water inlet 1a and flow out of the other liquid cooling plate 1 from the water outlet 1b, so that the coolant can absorb the heat from the heat generating element 300 corresponding to the liquid cooling plate 1 in time to cool the heat generating element 300.

In an embodiment, referring to FIG. 2 and FIG. 3, when the coolant flows into the liquid cooling loop, a flow direction of the coolant in the liquid cooling loop can be configured as required. For example, the first motherboard 202 corresponding to the one liquid cooling plate 1 may be located above the second motherboard 201 corresponding to the other liquid cooling plate 1, so that the coolant first cools the upper heat generating element 300 and then cools the lower heat generating element 300. Alternatively, the first motherboard 202 corresponding to the one liquid cooling plate 1 may be located below the second motherboard 201 corresponding to the other liquid cooling plate 1, so that the coolant first cools the lower heat generating element 300 and then cools the upper heat generating element 300.

In an embodiment, the flow direction of the coolant in the plurality of liquid cooling loops may be the same. For example, in the first liquid cooling loop, the coolant flows from the first liquid cooling plate 11 to the third liquid cooling plate 13, and in the second liquid cooling loop, the coolant flows from the second liquid cooling plate 12 to the fourth liquid cooling plate 14. That is, in each liquid cooling loop, the coolant flows from the upper liquid cooling plate 1 to the lower liquid cooling plate 1. In another embodiment, each liquid cooling loop can be configured such that the coolant flows from the lower liquid cooling plate 1 to the upper liquid cooling plate 1.

In an embodiment, the flow direction of the coolant in the plurality of liquid cooling loops may be different. For example, in the first liquid cooling loop, the coolant flows from the first liquid cooling plate 11 to the third liquid cooling plate 13, and in the second liquid cooling loop, the coolant flows from the fourth liquid cooling plate 14 to the second liquid cooling plate 12. That is, in some liquid cooling loops, the coolant flows from the upper liquid cooling plate 1 to the lower liquid cooling plate 1, and in other liquid cooling loops, the coolant flows from the upper liquid cooling plate 1 to the lower liquid cooling plate 1.

In an embodiment, referring to FIG. 1 and FIG. 4, the liquid cooling device 100 further includes a plurality of first connecting joints 3 in communication with a plurality of water ports and a plurality of communication pipes in a one-to-one correspondence. The plurality of water ports include the water outlets 1b and the water inlets 1a, and the plurality of communication pipes include the series pipes 8 and the branch pipes 4.

Referring to FIG. 5, each first connecting joint 3 includes a first connecting portion 31, a first fixing portion 32, and a first pagoda portion 33 that are sequentially connected. The first connecting portion 31 is in communication with the corresponding water port. An outer periphery of the first pagoda portion 33 is provided with at least two conical protrusion structures. The first pagoda portion 33 is in communication with the corresponding communication pipe. The first fixing portion 32 is threadedly connected to a nut, so as to fix the first pagoda portion 33 to the corresponding communication pipe.

In this way, when the communication pipe and the first connecting joint 3 are connected, it is only necessary to rotate the nut to ensure that the water port can be reliably in communication with the corresponding communication pipe, thereby ensuring that the liquid cooling device 100 can effectively dissipate heat from the plurality of heat generating elements 300 at the same time when the coolant flows into the liquid cooling device 100. Since each communication pipe in the liquid cooling device 100 is connected to the corresponding water port through the first connecting joints 3 with the same structure, the flow balance between internal nodes of each liquid cooling loop can be well ensured, so that the coolant can be evenly distributed to each liquid cooling plate 1 and each communication pipe, so that the pressure loss during the flow of the coolant can be reduced, uniformity of heat dissipation can be ensured, and the overall heat dissipation efficiency can be improved. Furthermore, compared with the related art that uses a quick connecting joint to connect the liquid cooling plate 1 and the corresponding communication pipe, using the first connecting joint 3 to connect the communication pipe according the embodiment can not only effectively save the cost, but also effectively save a space occupied by internal connection nodes of the liquid cooling device 100, which is conducive to the miniaturization of the device. In addition, the at least two conical protrusion structures of the first pagoda portion 33 can effectively ensure that the communication pipe is not easy to be separated from the first pagoda portion 33 when the first pagoda portion 33 is in communication with the communication pipe, so that the sealing performance between the first connecting joint 3 and the communication pipe can be effectively ensured, and a connection portion between the first connecting joint 3 and the communication pipe can withstand a certain liquid pressure to avoid leakage.

The number of the conical protrusion structures in the first pagoda portion 33 may be configured as required, for example, two, three or more, and the plurality of conical protrusion structures are arranged along an extending direction of the first pagoda portion 33.

In an embodiment, as shown in FIG. 1 and FIG. 2, each motherboard 200 has a first side S1 and a second side S2. The two liquid cooling plates 1 in one liquid cooling loop includes the first liquid cooling plate 11 and the third liquid cooling plate 13. The at least two motherboards 200 includes the first motherboard 201 corresponding to the first liquid cooling plate 11 and the second motherboard 202 corresponding to the third liquid cooling plate 13. A gap is formed between the first motherboard 201 and the second motherboard 202. and the third liquid cooling plate 13 is provided in the gap. One end of the series pipe 8 is connected to the third liquid cooling plate 13, the other end of the series pipe 8 bypasses the first motherboard 201 from the first side S1 and is connected to the first liquid cooling plate 11. An end of the branch pipe 4 connected to the first liquid cooling plate 11, which is away from the first liquid cooling plate 11, bypasses the first motherboard 201 from the first side S1 and extends through the gap to the second side S2. An end of the branch pipe 4 connected to the third liquid cooling plate 13, which is away from the third liquid cooling plate 13, extends through the gap to the second side S2. In this way, the pipes of the liquid cooling loop can be arranged by fully utilizing the gap between the first motherboard 201 and the second motherboard 202, so that the structure of the whole liquid cooling device 100 is more compact, and the pipes of the liquid cooling device 100 can be limited in the liquid cooling device 100, thereby avoiding interference between the pipes and other components of the device.

The first side S1 and the second side S2 may be opposite sides of the motherboard 200, or may be adjacent two sides of the motherboard 200.

In an embodiment, as shown in FIGS. 1 to 3, the liquid cooling device 100 further includes a liquid distributor 7, a liquid supply pipe 71, and a liquid return pipe 72. The two branch pipes 4 of each liquid cooling loop are in communication with the liquid distributor 7. The liquid distributor 7 is provided with a liquid entering port and a liquid return port, the liquid supply pipe 71 is in communication with the liquid entering port, and the liquid return pipe 72 is in communication with the liquid return port. The liquid supply pipe 71 and the liquid return pipe 72 are configured to be connected to a liquid cooling distribution assembly (not shown). In this way, when the liquid cooling distribution assembly delivers the coolant to the liquid distributor 7 through the liquid supply pipe 71, the liquid distributor 7 can distribute the coolant to each liquid cooling loop, so that each liquid cooling loop has the coolant flowing therein, so as to cool the plurality of heat generating elements 300 at the same time, thereby ensuring the cooling effect of the liquid cooling device 100. The high-temperature coolant flowing out from each liquid cooling loop can flow back to the liquid cooling distribution assembly through the liquid distributor 7 and the liquid return pipe 74, thereby completing a flow circulation of the coolant.

In an embodiment, the liquid distributor 7 is provided on the second side S2 of the motherboard 200, so that the branch pipe 4 in the liquid cooling device 100 can be connected to the liquid distributor 7 conveniently, and a length of the branch pipe 4 can be effectively reduced, so as to reduce a flow path of the coolant, thereby ensuring that the coolant can more effectively dissipate heat when the coolant flows into the liquid cooling device 100.

In an embodiment, referring to FIG. 1, the liquid distributor 7 is provided with a plurality of liquid outlets and a plurality of liquid inlets. The plurality of liquid outlets are in communication with the branch pipes 4 that are in communication with the water inlet 1a in the plurality of liquid cooling loops in a one-to-one correspondence, and the plurality of liquid inlets are in communication with the branch pipes 4 that are in communication with the water outlets 1b in the plurality of liquid cooling loops in a one-to-one correspondence.

The liquid cooling device 100 further includes a plurality of second connecting joints 30 located at the plurality of liquid outlets and the plurality of liquid inlets, respectively. In an embodiment, the structure of the second connecting joint 30 is the same as that of the first connecting joint 3, and the structure of the second connecting joint 30 can be referred to FIG. 5. Each second connecting joint 30 includes a second connecting portion, a second fixing portion, and a second pagoda portion that are sequentially connected. The liquid outlets and the liquid inlets are each in communication with the corresponding second connecting portion. An outer periphery of the second pagoda portion is provided with at least two conical protrusion structures. The second pagoda portion is in communication with the corresponding branch pipe 4. The second fixing portion is configured to be threadedly connected to a nut 2, so as to fix the second pagoda portion to the corresponding branch pipe 4. In this way, it can be ensured that the liquid distributor 7 can simultaneously supply the coolant to each liquid cooling loop, so that the liquid cooling device 100 can dissipate heat from the plurality of heat generating elements 300 at the same time.

In addition, since each liquid outlet and each liquid inlet are connected to the corresponding branch pipe 4 through the second connecting joint 30, the flow resistance pressure drop between the liquid cooling loops is uniform, which enables the liquid distributor 7 to evenly distribute the coolant provided by the liquid cooling distribution assembly to each liquid cooling loop, and then the coolant can be evenly distributed to each liquid cooling plate 1 and each pipe. The pressure loss in the flowing process of the coolant is reduced, each liquid cooling plate 1 is ensured to achieve substantially the same cooling effect, and the overall heat dissipation efficiency is improved. Meanwhile, compared with the related art that uses a quick connecting joint to connect the branch pipe 4, using the second connecting joint 30 to connect the branch pipe 4 in the embodiment can not only effectively save the cost, but also effectively save a space occupied by the liquid cooling device 100, which is conducive to the miniaturization of the equipment. The at least two conical protrusion structures of the second pagoda portion can effectively ensure the sealing performance between the second connecting joint 30 and the branch pipe 4 when the second connecting joint 30 is in communication with the branch pipe 4, so that a connection portion between the second connecting joint 30 and the branch pipe 4 can withstand a certain liquid pressure to avoid leakage.

The positions of the liquid inlet and the liquid outlet in the liquid distributor 7 can be configured as required. For example, referring to FIG. 1, a plurality of liquid inlets can be arranged on the same side of the liquid distributor 7, and a plurality of liquid outlets can be arranged on the other side of the liquid distributor 7, so that when the liquid distributor is in communication with the liquid cooling loop, the liquid inlets and the liquid outlets can be conveniently distinguished, which is beneficial to improving the assembly efficiency. Alternatively, a plurality of liquid inlets can be arranged around a circumference of the liquid distributor 7, and the liquid outlets are arranged on a side of the liquid inlets in a one-to-one correspondence. In this way, when the liquid distributor 7 is connected to the liquid cooling loop, the branch pipe for liquid inlet in the liquid cooling loop can be in communication with the liquid outlet, the branch pipe for liquid outlet can be in communication with the liquid inlet, so that the positions of the branch pipe for liquid inlet and the branch pipe for liquid outlet in the same liquid cooling branch can be conveniently found.

The number of the conical protrusion structures in the second pagoda portion may be configured as required, for example, two, three or more, and the plurality of conical protrusion structures are arranged along the extending direction of the second pagoda portion.

In an embodiment, referring to FIG. 1, an end of the liquid supply pipe 71 away from the liquid distributor 7 is provided with a first quick-connecting male joint 5 configured to be in communication with a first quick-connecting female joint of the liquid cooling distribution assembly. An end of the liquid return pipe 72 away from the liquid distributor 7 is provided with a second quick-connecting male joint 6 configured to be in communication with a second quick-connecting female joint of the liquid cooling distribution assembly. In this way, the liquid distributor 7 can be quickly connected to the liquid cooling distribution assembly through the quick-connecting male joint 5 and the second quick-connecting male joint 6, which is conducive to improving the efficiency of the assembly process and facilitating the disassembly and maintenance of the liquid cooling device 100 and the external structure.

In an embodiment, referring to FIGS. 1 and 4, each liquid cooling plate 1 is provided with a plurality of fixing members 10 configured to fix the liquid cooling plates 1 to the corresponding motherboards 200. In this way, each liquid cooling plate 1 can be reliably fixed on the corresponding motherboard 200, thus ensuring each liquid cooling plate 1 attached to the corresponding heat generating element 300, so that the coolant flowing through the liquid cooling plate 1 can absorb the heat from the corresponding heat generating element 300 in time, and it is ensured that the liquid cooling plate 1 can reliably cool the corresponding heat generating element 300 to achieve the heat dissipation effect.

In an embodiment, the fixing member 10 is detachably connected to the motherboard 200, so that the motherboard 200 can be operated and maintained by removing the liquid cooling plate 1. The fixing member 10 may be a bolt, a screw, etc.

Referring to FIG. 1, a server is further provided according to an embodiment, which includes the liquid cooling device 100 of any one of the above embodiments.

In an embodiment, the server further includes a housing assembly (not shown) provided with a cavity. The liquid cooling device 100 is received in the cavity, and the at least two motherboards 200 are connected to the housing assembly. In this way, the housing assembly can effectively protect the components provided in the housing assembly, thereby ensuring the reliability among the components in the server.

In an embodiment, the server further includes a liquid cooling distribution assembly in communication with each of the liquid cooling loops. The liquid cooling distribution assembly is configured to deliver coolant to the plurality of liquid cooling loops and to collect coolant flowing out of the plurality of liquid cooling loops. In this way, the liquid cooling distribution assembly and the liquid cooling device 100 cooperatively form a circulation system of the coolant, so that the coolant can circulate in the liquid cooling device 100 to effectively dissipate heat from each heat generating element 300 in the server, thereby ensuring the reliability and stability of the operation of the motherboard 200 in the server.

According to the server, since the at least two motherboards 200 are stacked, and each motherboard 200 is provided with at least two heat generating elements 300, the heat generating elements 300 provided on different motherboards 200 can form an upper-lower layer structure, so that the space occupied by the plurality of motherboards 200 can be reduced, thereby facilitating the miniaturization of the server. Since the plurality of liquid cooling plates 1 are attached to the plurality of heat generating elements 300 in a one-to-one correspondence, and one liquid cooling plate 1 corresponding to one motherboard 200 is connected to another liquid cooling plate 1 corresponding to another motherboard 200 in series to form the cross-layer liquid cooling loop. When the coolant is supplied into each liquid cooling loop, the plurality of liquid cooling plates 1 in the liquid cooling device 100 can utilize the coolant to effectively dissipate heat from the plurality of heat generating elements 300 forming the upper-lower structure, and the problem of poor heat dissipation due to the narrow space corresponding to the motherboard 200 is avoided, thereby ensuring the stable and reliable operation of the motherboard 200. Since the two liquid cooling plates 1 corresponding to different motherboards 200 are connected in series to form one liquid cooling loop, compared with the related art that a single liquid cooling plate 1 forms a liquid cooling loop, there is no need to provide a separated communication loop for each liquid cooling plate 1 in the liquid cooling device 100, which is not only conducive to the miniaturization of the server, but also can fully utilize cooling capacity of the coolant, so as to avoid resource waste while ensuring a heat dissipation effect.

The above-mentioned embodiments do not constitute a limitation on the protection scope of the technical solution. Any modifications, equivalent replacements and improvements made within the spirit and principles of the above-mentioned embodiments shall be included within the protection scope of this technical solution.

The foregoing descriptions are merely specific embodiments of the present disclosure, but are not intended to limit the protection scope of the present disclosure. Any variation or replacement readily figured out by a person skilled in the art within the technical scope disclosed in the present disclosure shall all fall within the protection scope of the present disclosure.

What is claimed is:

1. A liquid cooling device, comprising:

at least two motherboards that are stacked, and each of the motherboards being provided with at least two heat generating elements;

a plurality of liquid cooling plates attached to each of the heat generating elements are in a one-to-one correspondence, a plurality of liquid cooling loops including the liquid cooling plates, the plurality of liquid cooling loops are connected in parallel; and a liquid distributor, the liquid distributor configured to supply and return coolant from each of the liquid cooling loops, wherein each of the liquid cooling loops having one of the liquid cooling plates corresponding to one of the motherboards connected to another of the liquid cooling plates corresponding to another of the motherboards in series to form a respective one of a plurality of liquid cooling loops, and wherein a gap is formed between the one motherboard and the another motherboard, the heat generating elements and the attached liquid cooling plates of the one of the motherboards are provided in the gap, and the heat generating elements and the attached liquid cooling plates of the another of the motherboards are provided outside of the gap.

2. The liquid cooling device according to claim 1, wherein the plurality of liquid cooling plates comprises a first liquid cooling plate, a second liquid cooling plate, a third liquid cooling plate, and a fourth liquid cooling plate, the first liquid cooling plate and the second liquid cooling plate are respectively attached to two corresponding ones of the heat generating elements located on the one of the motherboards, the third liquid cooling plate and the fourth liquid cooling plate are respectively attached to two corresponding ones of the heat generating elements located on the another of the motherboards, the first liquid cooling plate and the third liquid cooling plate are connected in series to form a first liquid cooling loop of the liquid cooling loops, the second liquid cooling plate and the fourth liquid cooling plate are connected in series to form a second liquid cooling loop of the liquid cooling loops, and the first liquid cooling loop and the second liquid cooling loop are connected in parallel.

3. The liquid cooling device according to claim 1, further comprising a plurality of series pipes and a plurality of branch pipes, wherein each of the liquid cooling plates is provided with a water inlet and a water outlet, in two of the liquid cooling plates forming each of the liquid cooling loops, the water inlet of one of the liquid cooling plates is in communication with the water outlet of another of the liquid cooling plates through one of the series pipes, and the water inlet of the one of the liquid cooling plates and the water outlet of the another of the liquid cooling plates are in communication with two of the branch pipes, respectively.

4. The liquid cooling device according to claim 3, further comprising a plurality of first connecting joints in communication with the water outlets, the water inlets, the series pipes, and the branch pipes.

5. The liquid cooling device according to claim 4, wherein each of the first connecting joints comprises a first connecting portion, a first fixing portion, and a first pagoda portion that are sequentially connected, the first connecting portion is in communication with a corresponding one of the water outlet or a corresponding one of the water inlet, an outer periphery of the first pagoda portion is provided with at least two conical protrusion structures, the first pagoda portion is in communication with a corresponding one of the series pipes or a corresponding one of the branch pipes, and the first fixing portion is threadedly connected to a nut, so as to fix the first pagoda portion to the corresponding one of the series pipes or the corresponding one of the branch pipes.

6. The liquid cooling device according to claim 3, wherein each of the motherboards has a first side and a second side, the two of the liquid cooling plates in one of the liquid cooling loops comprises a first liquid cooling plate and a third liquid cooling plate, the at least two motherboards comprises a first motherboard corresponding to the first liquid cooling plate and a second motherboard corresponding to the third liquid cooling plate, the third liquid cooling plate is provided in the gap, one end of the corresponding one of the series pipes is connected the third liquid cooling plate, another end of the corresponding one of the series pipes bypasses the first motherboard from the first side and is connected to the third liquid cooling plate, an end of a first one of the branch pipes connected to the first liquid cooling plate, which is away from the first liquid cooling plate, bypasses the first motherboard from the first side and extends through the gap to the second side, and an end of a second one of the branch pipes connected to the third liquid cooling plate, which is away from the third liquid cooling plate, extends through the gap to the second side.

7. The liquid cooling device according to claim 3, further comprising a liquid supply pipe and a liquid return pipe, wherein the two of the branch pipes of each of the liquid cooling loops are in communication with the liquid distributor, and the liquid distributor is provided with a liquid entering port in communication with the liquid supply pipe and a liquid return port in communication with the liquid return pipe.

8. The liquid cooling device according to claim 7, wherein the liquid distributor is provided with a plurality of liquid outlets and a plurality of liquid inlets, each of the plurality of liquid outlets is in communication with one of the two of the branch pipes that is in communication with the water inlet of the another of the liquid cooling plates in the respective one of the plurality of liquid cooling loops with one of the liquid outlets for each of the one of the two of the branch pipes, and each of the plurality of liquid inlets is in communication with another of the two of the branch pipes that is in communication with the water outlet of the one of the liquid cooling plates in the respective one of the plurality of liquid cooling loops with one of the liquid inlets for each of the another of the two of the branch pipes.

9. The liquid cooling device according to claim 8, further comprising a plurality of second connecting joints located at the plurality of liquid outlets and the plurality of liquid inlets, respectively, wherein each of the second connecting joints comprises a second connecting portion, a second fixing portion, and a second pagoda portion that are sequentially connected, the liquid outlets and the liquid inlets are each in communication with a corresponding one of the second connecting portions, an outer periphery of the second pagoda portion is provided with at least two conical protrusion structures, the second pagoda portion is in communication with a corresponding one of the branch pipes, and the second fixing portion is configured to be threadedly connected to a nut, so as to fix the second pagoda portion to the corresponding one of branch pipes.

10. The liquid cooling device according to claim 9, wherein an end of the liquid supply pipe away from the liquid distributor is provided with a first quick-connecting male joint configured to be in communication with a first quick-connecting female joint of a liquid cooling distribution assembly, an end of the liquid return pipe away from the liquid distributor is provided with a second quick-connecting male joint configured to be in communication with a second quick-connecting female joint of the liquid cooling distribution assembly.

11. The liquid cooling device according to claim 1, further comprising a plurality of fixing members configured to fix the liquid cooling plates to a corresponding one of the motherboards.

12. A server, comprising the liquid cooling device according to claim 1.

* * * * *